(12) United States Patent
McLellan et al.

(10) Patent No.: US 6,995,460 B1
(45) Date of Patent: *Feb. 7, 2006

(54) LEADLESS PLASTIC CHIP CARRIER WITH ETCH BACK PAD SINGULATION

(75) Inventors: Neil McLellan, Hong Kong (HK); Chun Ho Fan, Hong Kong (HK); Kwok Cheung Tsang, Hong Kong (HK); Kin Pui Kwan, Hong Kong (HK); Wing Him Lau, Hong Kong (HK)

(73) Assignee: ASAT Ltd., New Territories (HK)

( * ) Notice: Subject to any disclaimer, the term of this patent is extended or adjusted under 35 U.S.C. 154(b) by 0 days.

This patent is subject to a terminal disclaimer.

(21) Appl. No.: 11/123,489

(22) Filed: May 6, 2005

Related U.S. Application Data

(63) Continuation of application No. 09/802,678, filed on Mar. 9, 2001, now Pat. No. 6,933,594, which is a continuation-in-part of application No. 09/288,352, filed on Apr. 8, 1999, now Pat. No. 6,498,099, which is a continuation-in-part of application No. 09/095,803, filed on Jun. 10, 1998, now Pat. No. 6,229,200.

(51) Int. Cl.
  *H01L 23/495* (2006.01)
(52) U.S. Cl. .................. 257/676; 257/691; 257/737; 257/738; 257/786
(58) Field of Classification Search .......... 257/735, 257/778, 780, 781, 786, 787, 676, 691, 692, 257/737, 738
See application file for complete search history.

(56) References Cited

U.S. PATENT DOCUMENTS

| | | |
|---|---|---|
| 4,530,152 A | 7/1985 | Roche et al. |
| 4,685,998 A | 8/1987 | Quinn et al. |
| 5,066,831 A | 11/1991 | Spielerger et al. |
| 5,293,072 A | 3/1994 | Tsuji et al. |
| 5,444,301 A | 8/1995 | Song et al. |
| 5,457,340 A | 10/1995 | Templeton, Jr. et al. |
| 5,710,695 A | 1/1998 | Manteghi |
| 5,777,382 A | 7/1998 | Abbott et al. |
| 5,900,676 A | 5/1999 | Kweon et al. |
| 5,976,912 A | 11/1999 | Fukutomi et al. |
| 6,001,671 A | 12/1999 | Fjelstad |
| 6,057,601 A | 5/2000 | Lau et al. |
| 6,081,029 A | 6/2000 | Yamaguchi |

(Continued)

FOREIGN PATENT DOCUMENTS

JP   59-208756   11/1984

OTHER PUBLICATIONS

U.S. Appl. No. 10/697,339, Neil McLellan et al., "Process for Fabricating a Leadless Plastic Chip Carrier", filed Oct. 30, 2003, currently pending.

(Continued)

*Primary Examiner*—Minh-Loan Tran
(74) *Attorney, Agent, or Firm*—Keating & Bennett, LLP

(57) ABSTRACT

A leadless plastic chip carrier is constructed by half etching one or both sides of the package design onto a leadframe strip so as to create unique design features such as power and/or ground ring surrounding the die attach pad, interlocking rivet head construction for the contact pads, and an interlocking pattern for the die attach pad. After wire bonding and molding, a further etching is performed to isolate and expose contact pads. Singulation of individual chip packages from the leadframe strip is then performed by saw singulation or die punching.

19 Claims, 15 Drawing Sheets

U.S. PATENT DOCUMENTS

| | | |
|---|---|---|
| 6,093,584 A | 7/2000 | Fjelstad |
| 6,194,786 B1 | 2/2001 | Orcutt |
| 6,229,200 B1 | 5/2001 | Mclellan et al. |
| 6,238,952 B1 | 5/2001 | Lin |
| 6,294,100 B1 | 9/2001 | Fan et al. |
| 6,294,830 B1 | 9/2001 | Fjelstad |
| 6,306,685 B1 | 10/2001 | Liu et al. |
| 6,372,539 B1 | 4/2002 | Bayan et al. |
| 6,459,163 B1 | 10/2002 | Bai |
| 6,498,099 B1 | 12/2002 | Mclellan et al. |
| 6,528,877 B2 | 3/2003 | Ernst et al. |
| 6,545,347 B2 | 4/2003 | Mclellan |
| 6,585,905 B1 | 7/2003 | Fan et al. |
| 6,586,677 B2 | 7/2003 | Glenn |
| 6,635,957 B2 | 10/2003 | Kwan et al. |
| 6,821,821 B2 | 11/2004 | Fjelstad |
| 2003/0015780 A1 | 1/2003 | Kang et al. |

OTHER PUBLICATIONS

U.S. Appl. No. 10/353,241, Neil McLellen et al., "Leadless Plastic Chip Carrier With Etch Back Pad Singulation", filed Jan. 28, 2003, currently pending.

U.S. Appl. No. 10/757,499, Chun Ho Fan et al., Electronic Components Such as Thin Array Plastic Packages and Process for Fabricating Same, filed Jan. 15, 2004, currently pending.

U.S. Appl. No. 09/802,678, Neil McLellan et al., Leadless Plastic Chip Carrier With Etch Back Pad Singlulation, filed Mar. 9, 2001, currently pending.

(Prior Art)

Step 1: Raw material (Copper Panel)

Step 2: Both side partial etch

Step 3: Full Ni / Pd plating

Step 4: Assembly ( D / A, W / B and Molding )

Step 5: Photo-resist (wet film) printing and curing (development)

(Prior Art)

Step 6: Final etching

Step 6.1: Stripping

Step 7: Electroless gold plating

Step 8: Singulation ( sawing or punching )

Step 1: Raw material (Copper Panel)

(Prior Art)

Step 2: Both side partial etch (Mirror image)

(Prior Art)

Step 3: Full Ni / Pd or Ag plating (Prior Art)

Step 4: Assembly ( D / A, W / B and Molding )

(Prior Art)

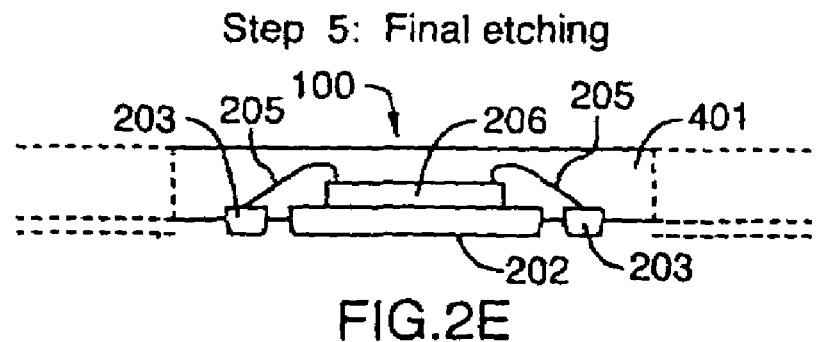
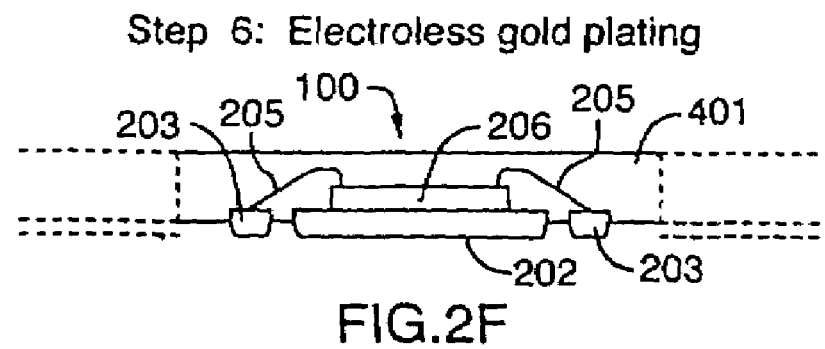
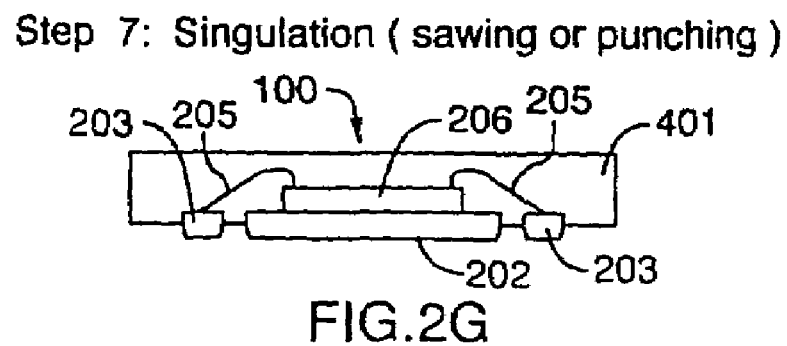

(Prior Art)

Step 1: Raw material (Copper Panel)

Step 2: Top side partial etch

Step 3: Full Ni / or Ag plating

Step 4: Assembly ( D / A, W / B and Molding )

(Prior Art)

Step 6: Electroless gold plating (Prior Art)

Step 7: Solder ball attachment (optional)

(Prior Art)

Step 8: Singulation ( sawing or punching )

(Prior Art)

Step 1: Raw material (Copper Panel)

(Prior Art)

Step 2: Top side partial etch (Prior Art)

Step 3: Full Ni / or Ag plating (Prior Art)

Step 4: Assembly ( D / A, W / B and Molding )

(Prior Art)

Step 5: Photo-resist application, exposure, and developing (Prior Art)

Note : Dry film laminating or Wet-film spin coating (Prior Art)

Step 6: Final etching

Step 7: Photo-resist stripping

Step 8: Electroless gold plating

Step 8: Singulation (sawing or punching)

Step 1: Raw material (Copper Panel)

(Prior Art)

Step 2: Photo resist lamination and development (Prior Art)

Step 3: Cu/Ni/Au electrolytic plat up for "1st level connect"

(Prior Art)

Step 4: Stripping (Prior Art)

Step 5: -ve photo-resist lamination and development (Prior Art)

(Prior Art)

Step 6: Pre-etch for 2nd level connect

Step 7: Stripping and clearing

Step 8: Assembly (D/A, W/B and Mold)

Step 9: Assembly (Post etching)

Step 10: Singulation

Step 1: Raw Material (Copper Panel)

Step 2: Masking for Plate-Up Process

Step 3: Plate-Up for "1st Level Connect"

Option A

Options B and C

Options B and C

Options B and C

For Option B: Gold Layer
For Option C: Tin Layer

Peripheral Type (Single Row)

LEADLESS PLASTIC CHIP CARRIER WITH ETCH BACK PAD SINGULATION

CROSS-REFERENCE TO RELATED APPLICATION

This is a Continuation Application of U.S. patent application Ser. No. 09/802,678, filed on Mar. 9, 2001 U.S. Pat. No. 6,933,594; which is a Continuation-In-Part of U.S. patent application Ser. No. 09/288,352, filed Apr. 8, 1999, now U.S. Pat. No. 6,498,099; which is a Continuation-In-Part Application of U.S. patent application Ser. No. 09/095,803, filed Jun. 10, 1998, now U.S. Pat. No. 6,229,200.

FIELD OF THE INVENTION

The present invention relates in general to integrated circuit packaging, and more particularly to an improved process for fabricating a leadless plastic chip carrier which includes a post mold etch back step and unique contact pad and die attach pad design features.

BACKGROUND OF THE INVENTION

According to well known prior art IC (integrated circuit) packaging methodologies, semiconductor dice are singulated and mounted using epoxy or other conventional means onto respective die pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting up to several hundred devices. Singulated IC dice are placed on the strip die attach pads using conventional die mount and epoxy techniques. After curing of the epoxy, the dice are gold wire bonded to peripheral internal leads. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die paddle is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' co-pending patent application Ser. No. 09/095,803, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern of fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicant's co-pending U.S. patent application Ser. No. 09/288,352, the contents of which are incorporated herein by reference, an etch back process is provided for the improved manufacture of the LPCC IC package. The leadframe strip is first subjected to a partial etch on one or both of the top and bottom surfaces in order to create a pattern of contact leads (pads) and a die attach pad (paddle). After wire bonding the contacts to a singulated semiconductor die, followed by overmolding and curing of the mold, the leadframe strip is exposed to a second full etch immersion for exposing the contact pads in an array pattern (i.e. multi-row) or perimeter pattern (i.e. single row), as well as the die attach pad. In the case of a package with multi-row I/O leads, this etch back step eliminates the requirement for two additional saw singulation operations (i.e. to sever the inner leads from the outer leads), and in both the single-row and multi-row configurations, the etch back step eliminates post mold processing steps (e.g. mold deflashing) and ensures superior device yield over the processing technique set forth in Applicants' prior application Ser. No. 09/095,803. Additionally, using this technique allows for higher I/O pad density and also allows for pad standoff from the package bottom which reduces stress in the solder joint during PCB temp cycling. Further, the technique allows for the use of a pre-singulation strip testing technique given that the electrical I/O pads are now isolated from each other and testing in strip can take place. This feature greatly increased the handling and throughput of the test operation.

Other prior art references teach the concepts of etching back a sacrificial substrate layer to expose contact pads and die attach paddle, such as U.S. Pat. No. 4,530,152 (Roche et al); U.S. Pat. No. 5,976,912 (Fukutomi, et al); U.S. Pat. No. 6,001,671 (Fjelstad) and Japanese patent application no. 59-208756 (Akiyama).

SUMMARY OF THE INVENTION

According to the present invention, Applicant's etch-back LPCC process has been modified to provide additional design features. Firstly, an etch barrier is provided as the first layer of the contact pads and die attach pad, and the contact pads are formed to a "rivet" head shape for improved interlocking and the die attach pad is formed with an interlock pattern for improved alignment with the semiconductor die. Improved electrical performance is enjoyed over the above discussed prior art designs by incorporation of a ground ring on the die attach pad to which multiple ground pads on the die are parallel bonded. The incorporation of a ground ring on the die attach pad provides a constant distance between the ground ring and the ground pads to which the ground ring is wire bonded. The ground ring is then bonded out to only one of the external I/O pads.

According to a further embodiment of the invention, two concentric rings are provided to allow for both power and ground using only a single I/O pad for each.

According to an additional embodiment, an etch down cavity is provided for solder ball attachment.

BRIEF DESCRIPTION OF THE DRAWINGS

A detailed description of the invention is provided herein below with reference to the following drawings, in which:

FIGS. 2A–2G show processing steps for manufacturing a Leadless Plastic Chip Carrier (LPCC) with top and bottom partial etch incorporating standoff, according to a second embodiment of Applicants' prior art process;

DETAILED DESCRIPTION OF PREFERRED EMBODIMENT

Figure 1A:
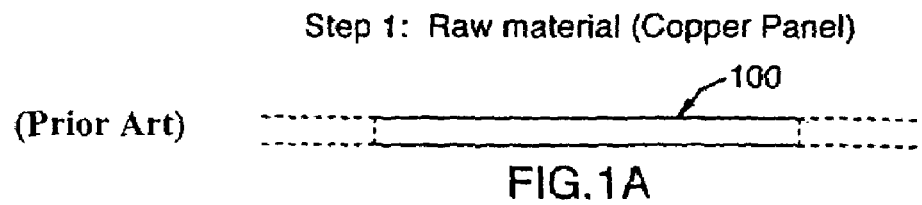
FIGS. 1A–1I show processing steps for manufacturing a Leadless Plastic Chip Carrier (LPCC) with top and bottom partial etch resulting in a bottom etch cavity, according to a first embodiment of Applicants' prior art process.

Applicants' prior Leadless Plastic Chip Carrier with Etch Back Singulation (LPCCEBS) process as described in copending application Ser. No. 09/288,352 is an improvement over Applicants' LPCC process as set forth in co-pending application Ser. No. 09/095,803. The present invention relates to an improvement in Applicants' prior LPCC methodology. Before describing details of the improvement according to the present invention, reference will be made to FIGS. 1 to 5 which set forth Applicants' LPCCEBS process. Where possible, the same reference numerals have been used in this application to denote identical features described in Applicants' earlier applications. Reference may be had to Applicants' co-pending applications for additional details concerning processing steps which are common to Applicants' processes.

FIGS. 1A–1I show steps in the manufacture of an LPCCEBS according to a first embodiment of the invention disclosed in copending application Ser. No. 09/288,352—namely, with top and bottom side partial etch and bottom etch cavity.

With reference to FIG. 1A, an elevation view is provided of a copper panel substrate which forms the raw material of the leadframe strip 100. As discussed in greater detail in Applicants' co-pending application Ser. No. 09/095,803, the leadframe strip 100 is divided into a plurality of sections, each of which incorporates a plurality of leadframe units in an array (e.g. 3×3 array, 5×5 array, etc.). Only one such unit is depicted in the elevation view of FIG. 1A, portions of adjacent units being shown by stippled lines.

The leadframe strip 100 is subjected to a partial etch on both top and bottom sides (FIG. 1B) to pattern the contact pads 203 and die attach pad 202. Next, the strip 100 is plated with silver (Ag) or nickel/palladium (Ni/Pd) to facilitate wire bonding (FIG. 1C).

A singulated semiconductor die 206 is conventionally mounted via epoxy (or other means) to the die attach pad 202, and the epoxy is cured. Gold wires 205 are then bonded between the semiconductor die 206 and peripheral leads or contacts 203. The leadframe 100 is then molded using a modified mold with the bottom cavity being a flat plate, and subsequently cured, as discussed in Applicants' application Ser. No. 09/095,803. The leadframe 100 after the foregoing steps is as shown in FIG. 1D, which includes overmold 401 of cured plastic or epoxy.

Next, rather than post-mold deflashing, as performed according to Applicants' prior methodology, a wet film layer of photoresist 402 is printed onto the bottom of leadframe 100 so as to cover portions of the bottom surface which are to be protected from etchant (i.e. positive photoresist). The photoresist is then developed (cured) using conventional means (FIG. 1E).

The leadframe 100 is then subjected to a final etching via full immersion (FIG. 1F) which exposes an array or perimeter pattern of exposed contact pads 203 and the die attach pad 206.

The photoresist layer 402 is then stripped using conventional means (FIG. 1G), resulting in small protrusions below the molded body for contact pads 203. After this etch back step, the leadframe strip 100 is coated with either electroless gold or solder dip to facilitate pad soldering (FIG. 1H). Alternatively, barrel plated solder or chemically passivated bare copper may be used for terminal finishing.

At this stage of manufacture, the pads 203 and 202 are fully isolated and exposed. Singulation of the individual units from the full leadframe array strip 100 may then be performed either by saw singulation or die punching (FIG. 1I).

Figure 1B:
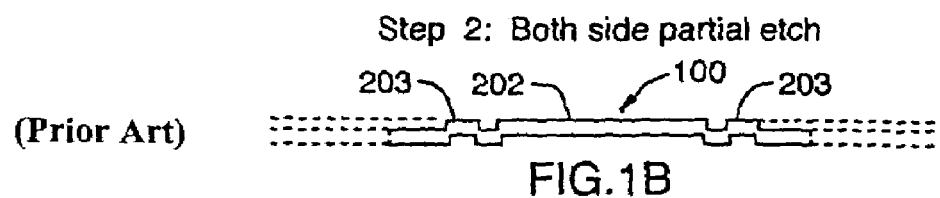
Figure 1C:
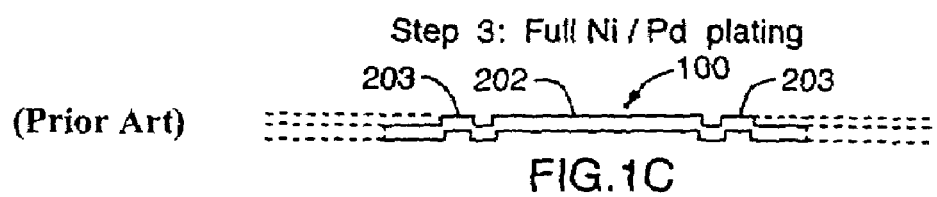
Figure 1D:
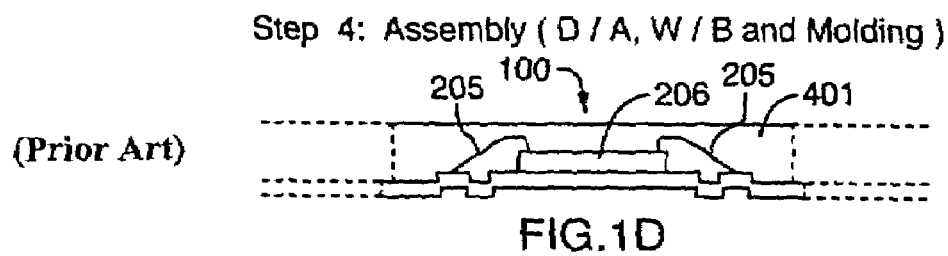
Figure 1E:
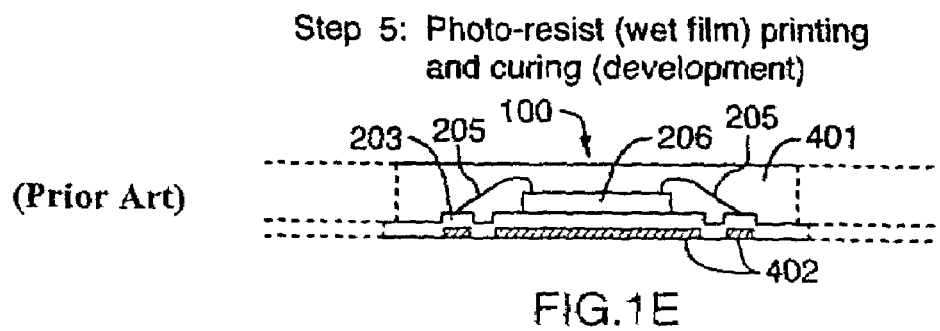
Figure 1F:
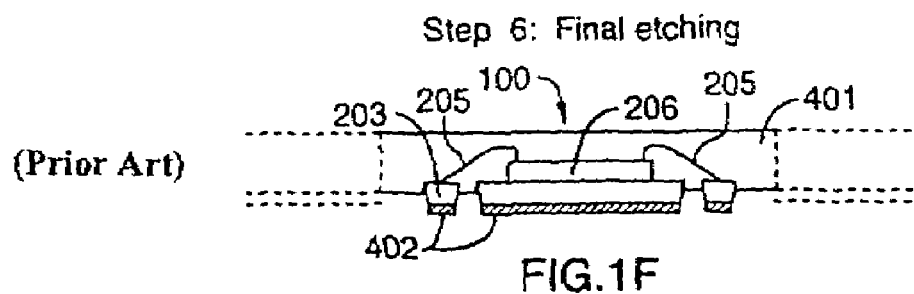
Figure 1G:
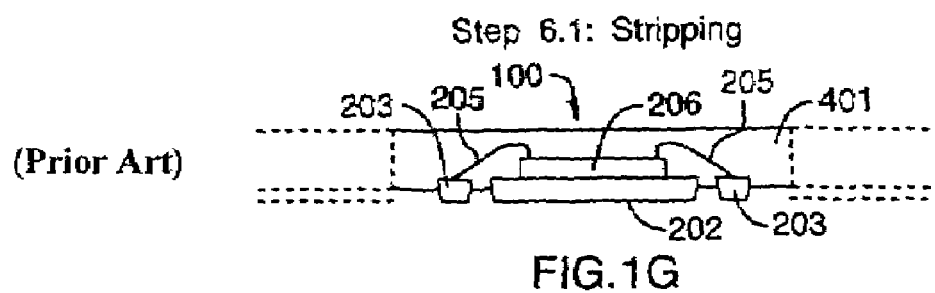
Figure 1H:
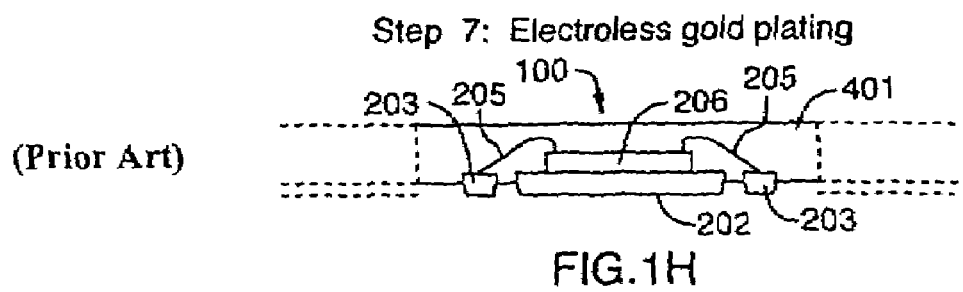
Figure 1I:
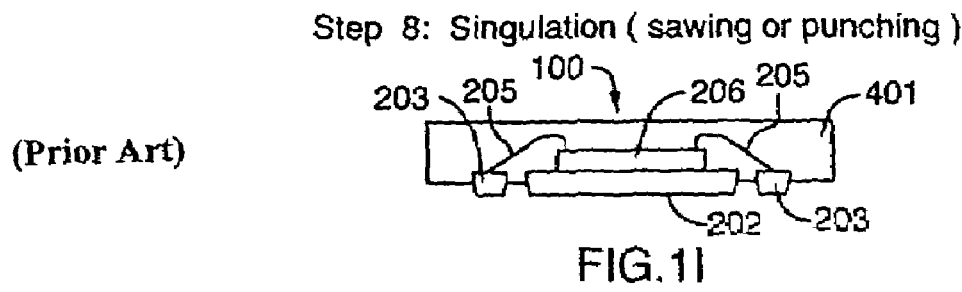
Figure 2A:
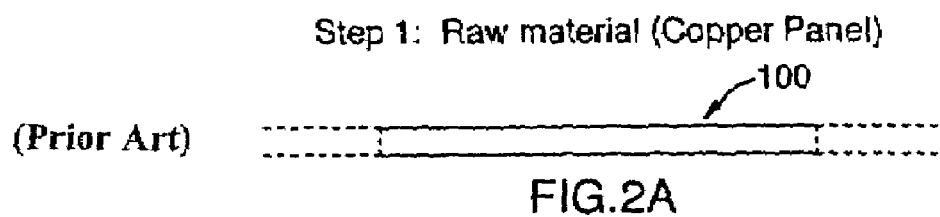
Figure 2B:
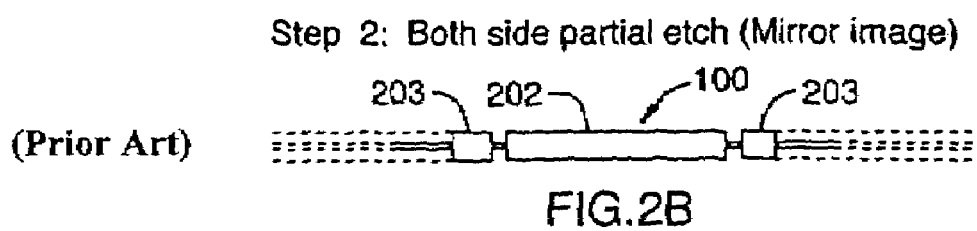
Figure 2C:
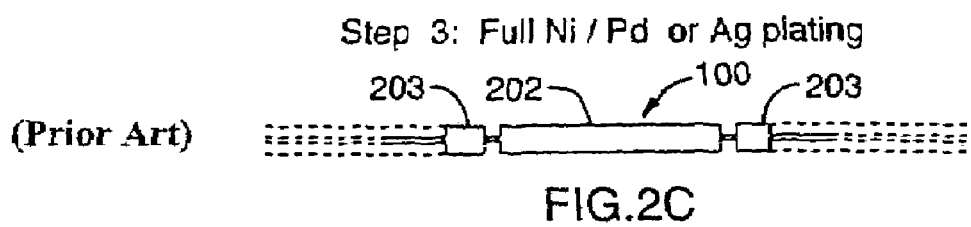
Figure 2D:
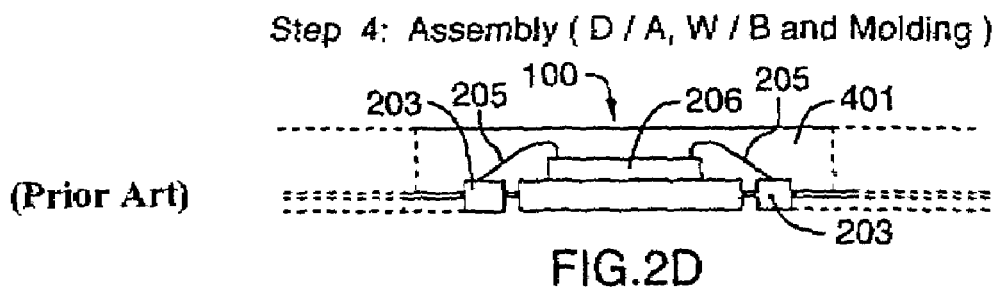
Figure 3A:
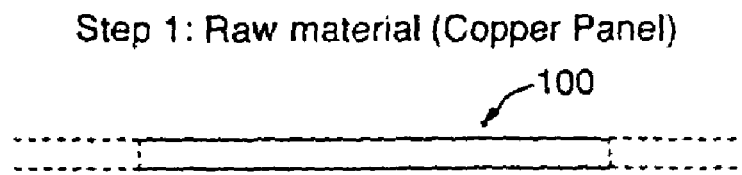
FIGS. 3A–3H show processing steps for manufacturing a Leadless Plastic Chip Carrier (LPCC) with top side partial etch and solder ball attachment, according to a third embodiment of Applicants' prior art process.
Figure 3B:
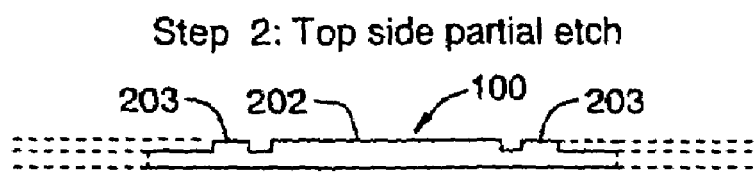
Figure 3C:
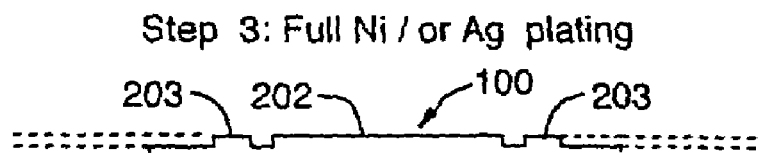
Figure 3D:
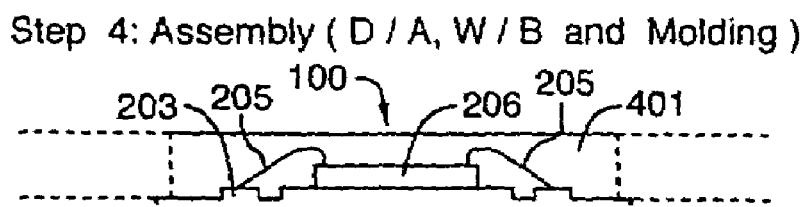
Figure 3E:
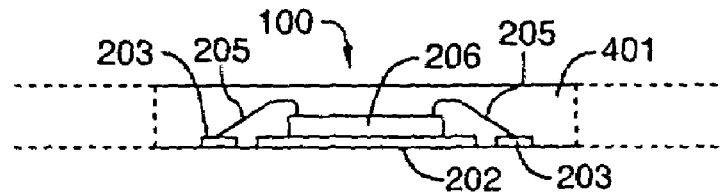
Figure 3F:
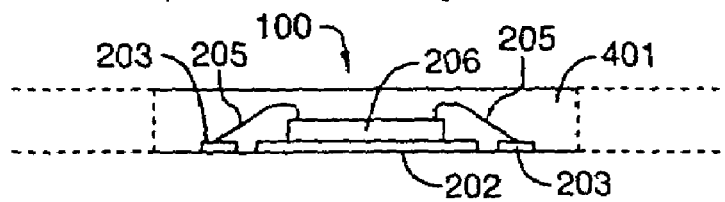
Figure 3G:
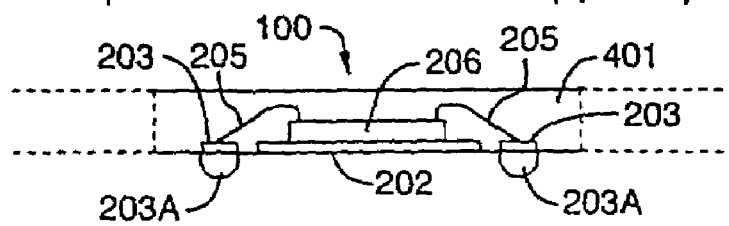
Figure 3H:
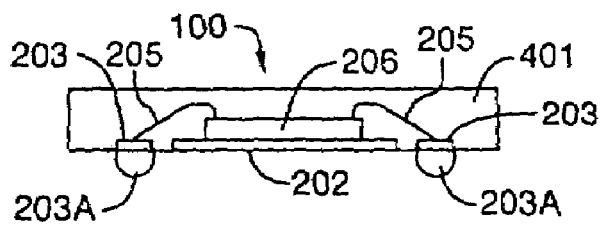
Figure 4A:
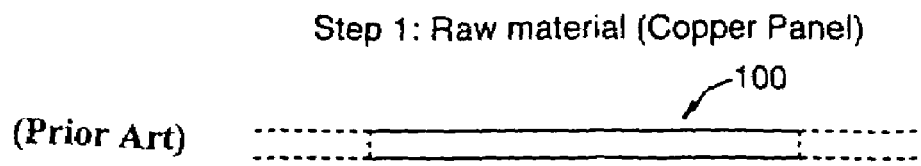
FIGS. 4A–4I show processing steps for manufacturing a Leadless Plastic Chip Carrier (LPCC) with top side partial etch incorporating standoff, according to a fourth embodiment of Applicants' prior art process.
Figure 4B:
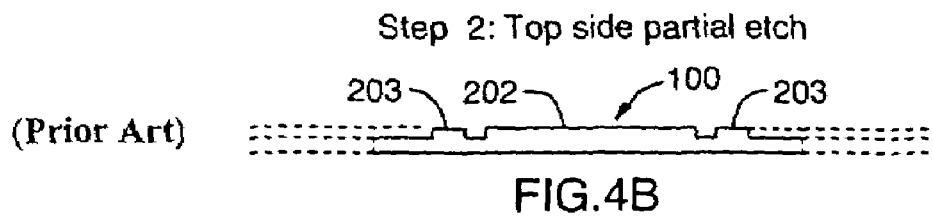
Figure 4C:
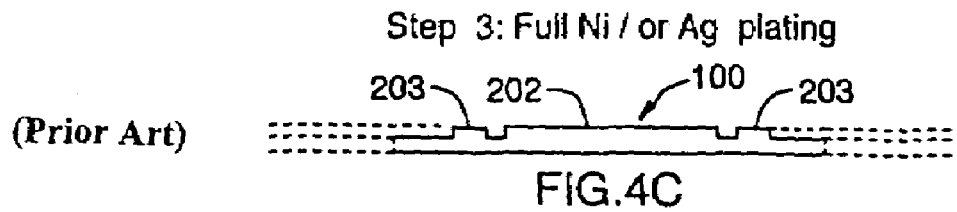
Figure 4D:
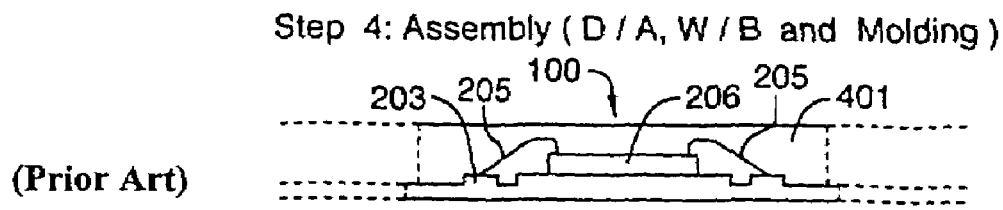
Figure 4E:
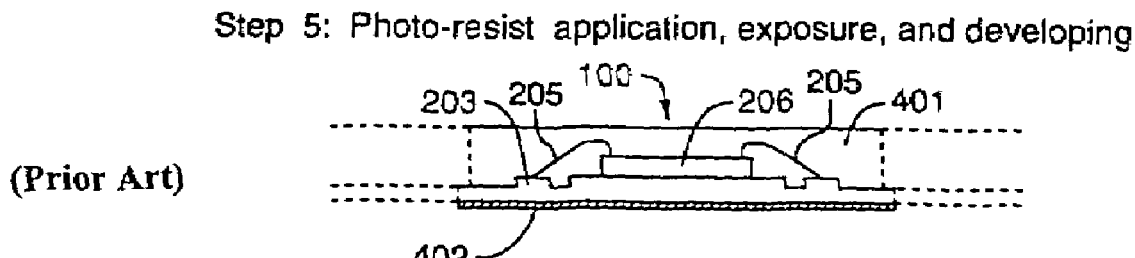
Figure 4F:
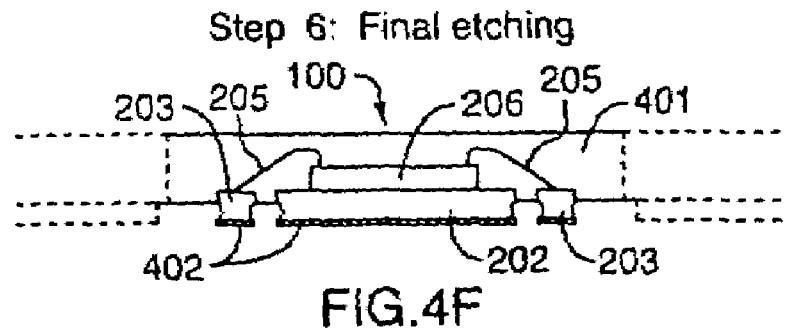
Figure 4G:
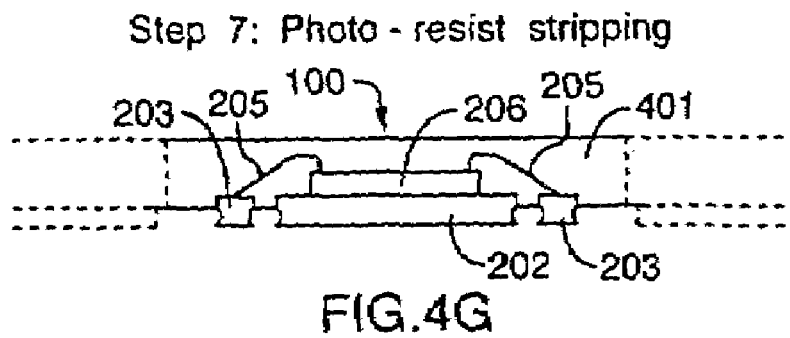
Figure 4H:
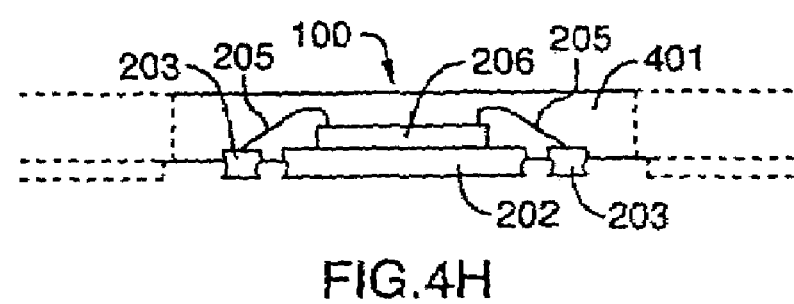
Figure 4I:
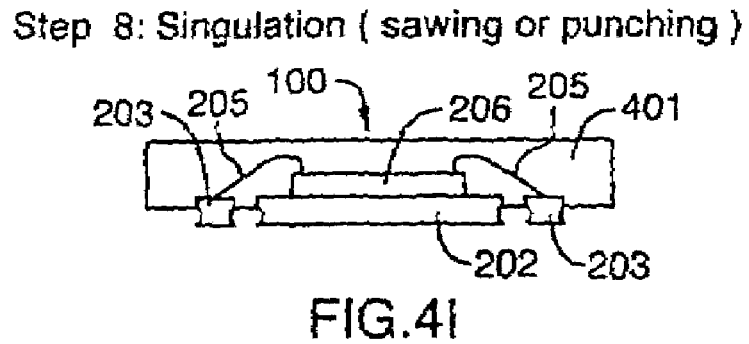

The embodiment of FIGS. 2A–2G is similar to that of FIGS. 1A–11, except that the partial etch (FIG. 2B) is a "mirror image" partial etch which results in a "standoff" structure, rather than being an offset pattern as shown in FIG. 1B. Consequently, no photoresist application is required following the mold step (FIG. 2D) and prior to the final etch back step (FIG. 2E).

Applicants' LPCC fabrication process may alternatively utilize a single side first partial etch, as shown in FIGS. 3 and 4. FIGS. 3A–3H show a single side partial etch process wherein, after the final full immersion etch and electroless gold plating (FIGS. 3E and 3F), the pads 203 are above the mold line so that solder balls 203A are required to be attached in order to allow board mounting. FIGS. 4A–4I show a single side first partial etch with standoff (similar in this respect to the process of FIG. 2). A layer of photoresist 402 is applied (FIG. 4E) and patterned, prior to the final etch back step (FIG. 4F). In other respects, the steps depicted in FIGS. 3 and 4 are similar to the steps discussed above and illustrated in FIGS. 1 and 2, respectively.

Figure 5A:
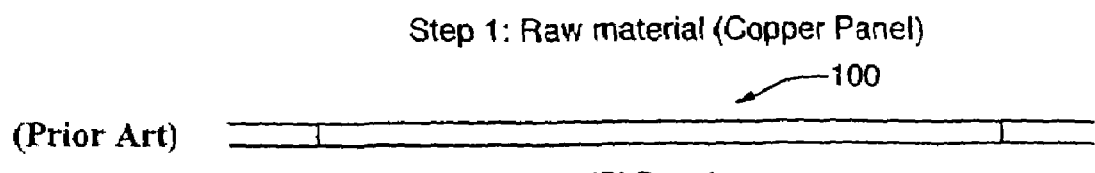
FIGS. 5A–5J show processing steps for manufacturing a Leadless Plastic Chip Carrier (LPCC) with bottom side partial etch, according to a fifth embodiment of Applicants' prior art process.
Figure 5B:
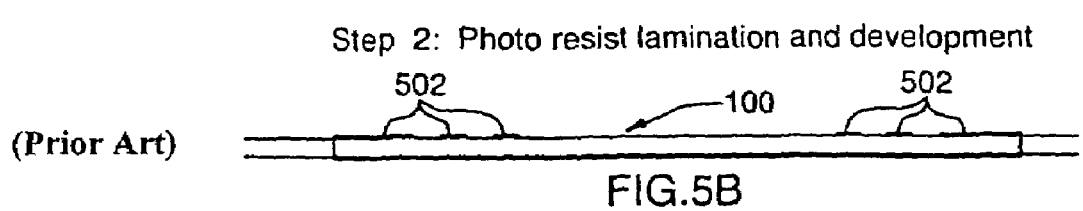
Figure 5C:
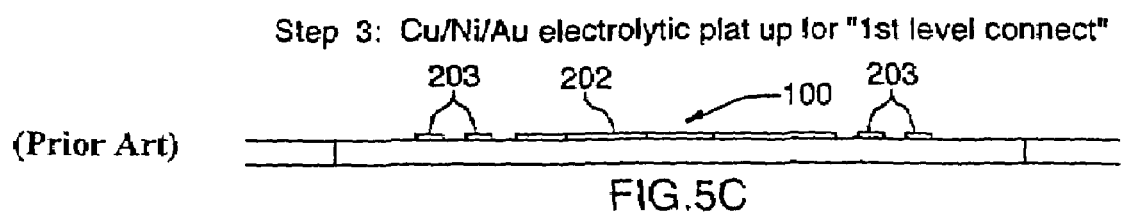
Figure 5D:
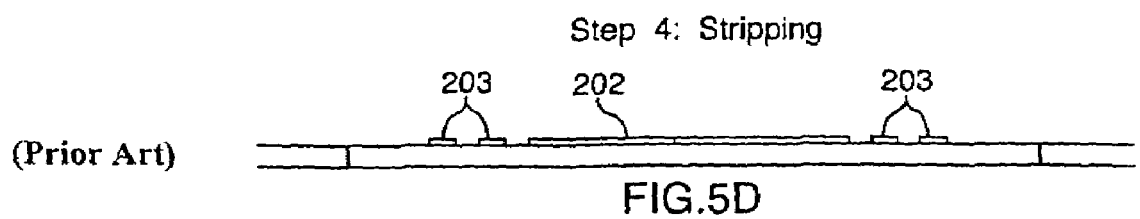

FIGS. 5A–5J show steps according to the etch back process of Applicants' prior invention, for fabricating an LPCC with multi-row partial lead isolation. In FIG. 5A, a copper panel is provided, to which photoresist 502 is applied and patterned for a "first level" connect (FIG. 5B). An electrolytic plat of Cu/Ni/Au is applied to portions of the leadframe strip not covered by photoresist (FIG. 5C). The photoresist is then stripped (FIG. 5D), resulting in the structure of FIG. 5D with contact pads 203 and attach pad 202.

Figure 5E:
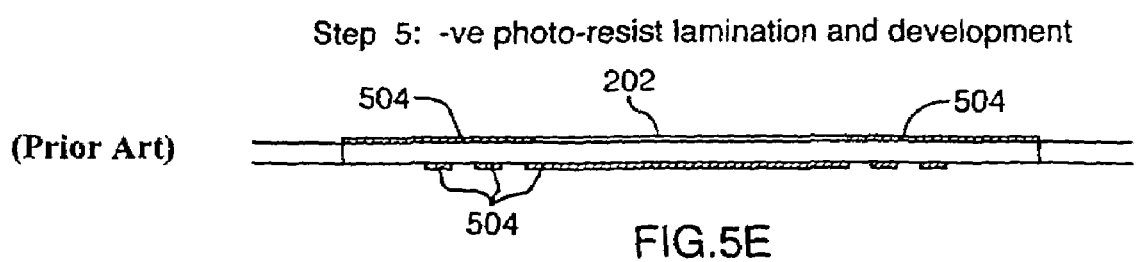
Figure 5F:
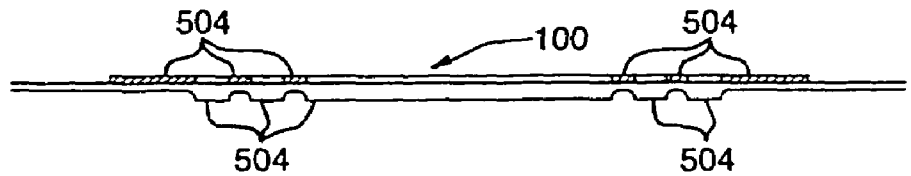
Figure 5G:
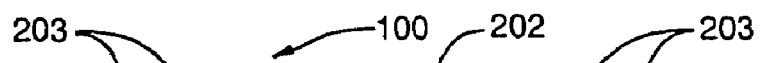

A layer of negative photoresist 504 is applied and patterned for a "second level" connect (FIG. 5E). A pre-etch step is then performed (FIG. 5F) to create contact and attach pad protrusions on the bottom of the structure. The photoresist 504 is then stripped and the structure is cleaned (FIG. 5G).

Figure 5H:
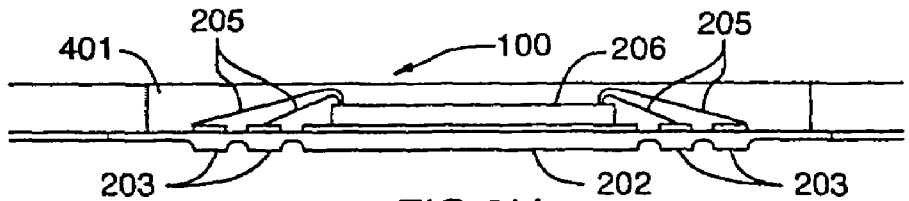
Figure 5I:
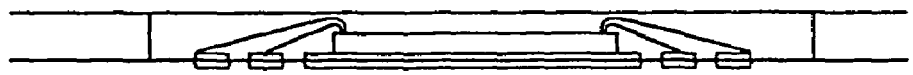
Figure 5J:
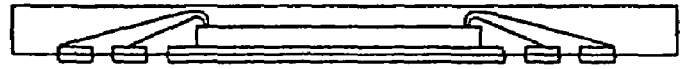

Next, the semiconductor 206 is attached to the pad 202, gold wire bonds 203 are attached to the multi-row leads 203 and the structure is encapsulated as discussed above in mold 401, such that the contact pad and attach pad protrusions remain exposed (FIG. 5H). A final etch back is performed (FIG. 5I) and the individual units are singulated. It will be noted that the steps in Applicants' prior LPCC process of saw singulating between the inner and outer rows of leads, is eliminated. Also, as with the embodiments of FIGS. 1 to 4, post mold deflashing and cleaning has been eliminated.

Figure 6A:
FIGS. 6A–6H show processing steps for manufacturing a Leadless Plastic Chip Carrier (LPCC) with etch back and special attachment features, according to the present invention.
Figure 6B:
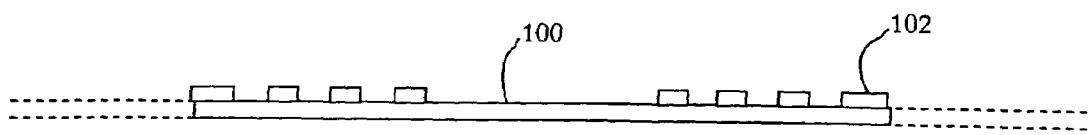
Figure 6C:
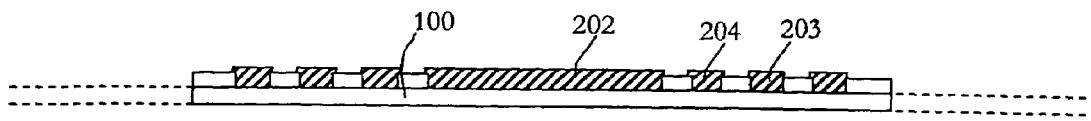
Figure 6D:
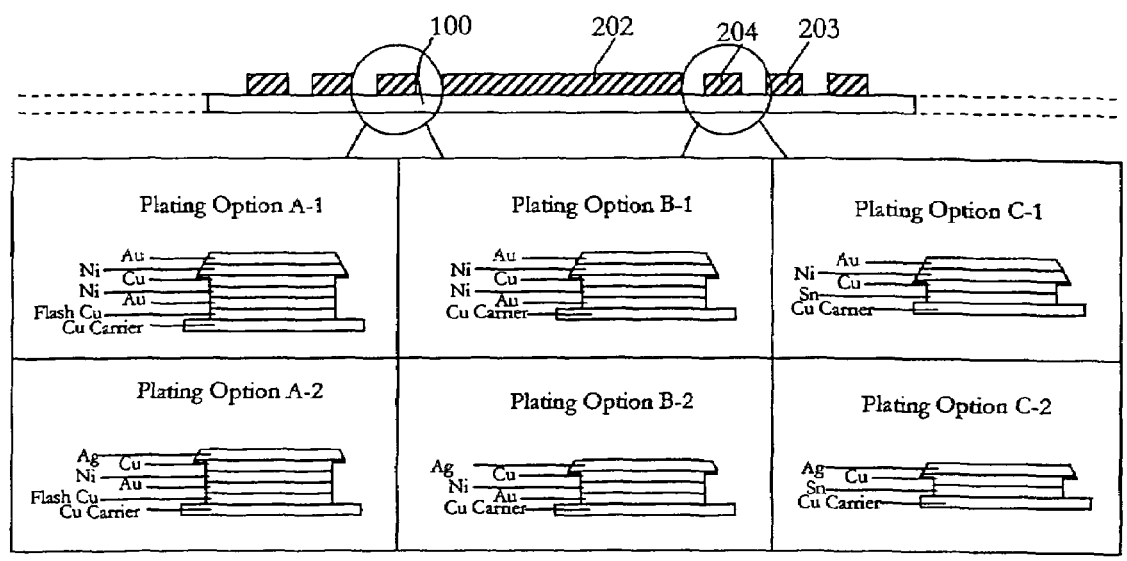
Figure 6E:
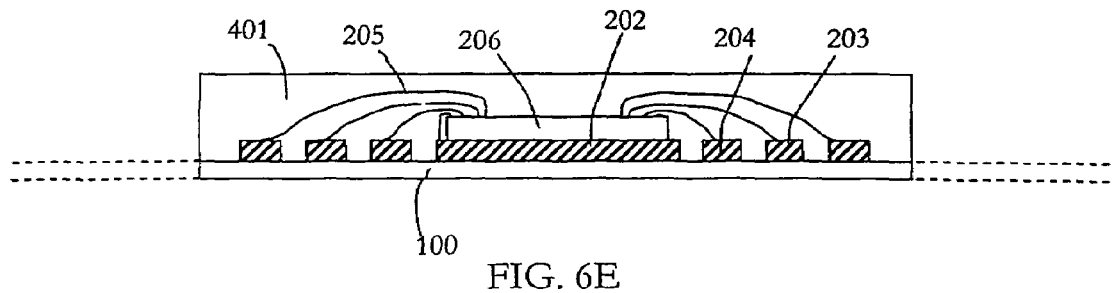
Figure 6F:
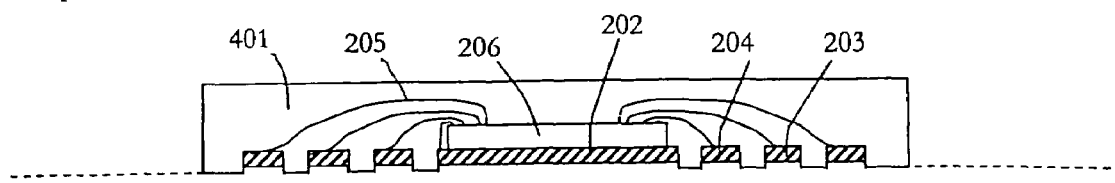
Figure 6F:
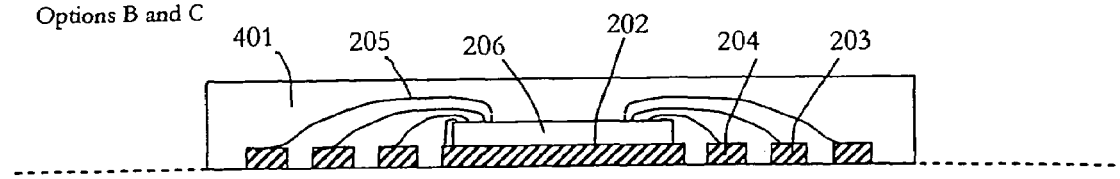
Figure 6F:
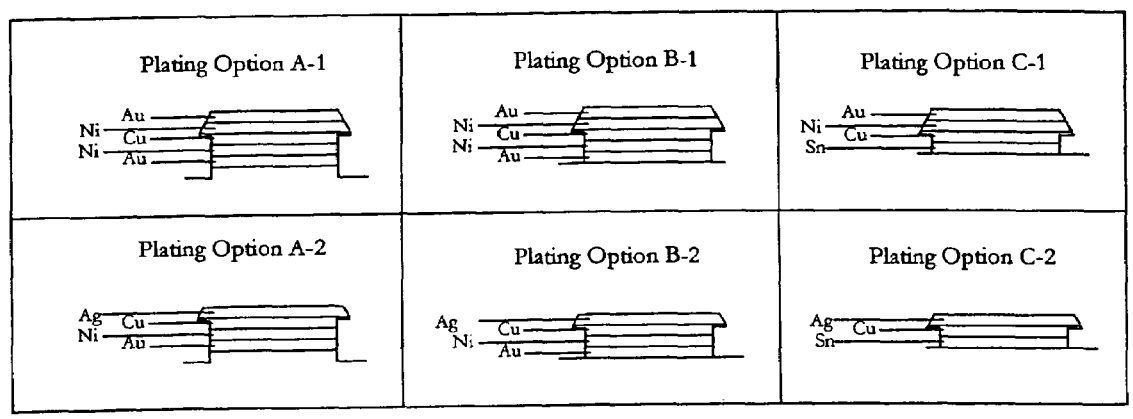
Figure 6G:
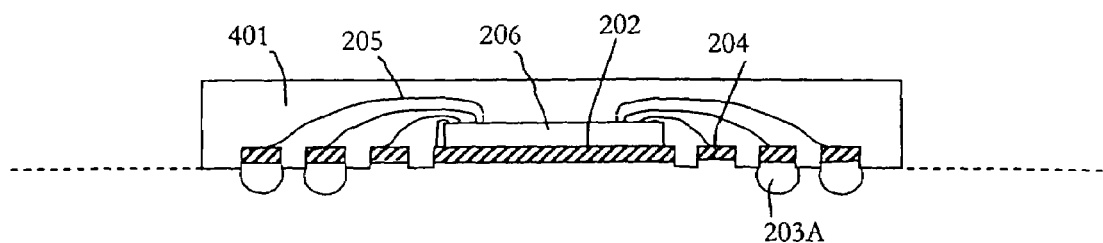
Figure 6H:
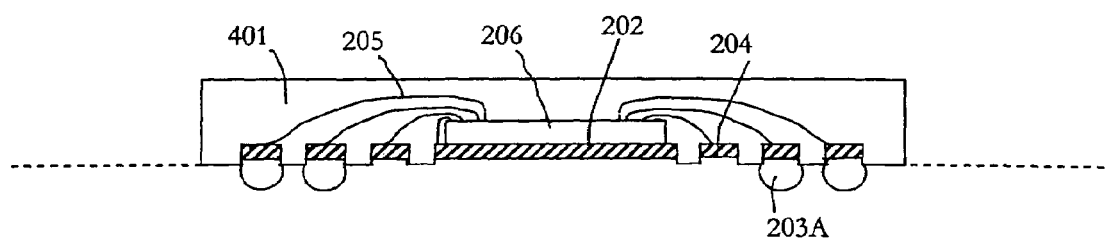
Figure 6H:
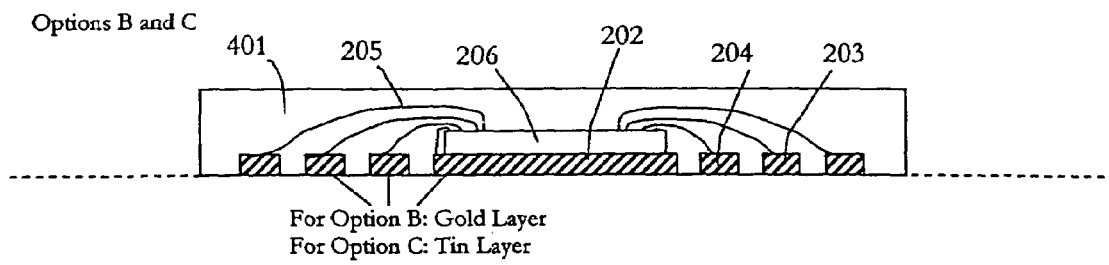
Figure 7:
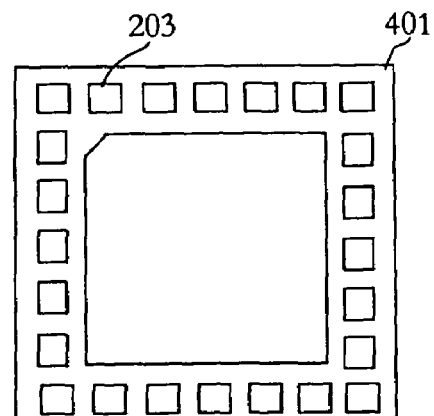
FIG. 7 is a bottom plan view of a single row IC package manufactured in accordance with the process of FIGS. 6A–6H.

Having thus described Applicants' prior LPCC and LPC-CEBS methodologies, reference will now be made to FIGS. 6, 7 and 8 showing the improvements which constitute the present invention.

With reference to FIG. 6A, an elevation view is provided of a copper panel substrate which forms the raw material of leadframe strip 100 having thickness of approximately 5 mils. As discussed in greater detail in Applicants' co-pending application Ser. No. 09/095,803, the leadframe strip is divided into a plurality of sections, each of which incorporates a plurality of leadframe units in an array (e.g. 3×3 array, 5×5 array, etc.). Only one such unit is depicted in the elevation view of FIG. 6A, portions of adjacent units being shown by stippled lines.

The leadframe strip 100 is covered with a photoresist mask 102 (FIG. 6B) in order to mask predetermined areas from subsequent multiple deposition steps (FIG. 6C). The leadframe strip 100 is then subjected to an etching process to create the contact pads 203, power or ground ring 204 attachment 204 and die attach pad 202 (FIG. 6D). The ring 204 can be either a power or a ground ring 204.

One feature of the present invention is the deliberate deposition of the photoresist mask 102 in only a very thin layer (e.g. 2 mils) such that each contact pad 203 is plated up into a columnar shape as it flows over the photoresist mask, resulting in a "mushroom cap" or rivet shape (FIGS. 6D and 6F). The shape of the contact pads 203 is such that they are capable of being locked into the mold body thereby providing superior board mount reliability. It is also contemplated that a "funnel" shape may be provided for the contact pads 203 by incorporating an angle on the photoresist mask.

As shown in FIG. 6D, several deposition and etching options are available. According to options A-1 and A-2, a layer of flash Cu (50 microinches) is provided over the Cu substrate for creating an etch down cavity following post etching (discussed in greater detail below with reference to FIG. 6F) for attaching solder balls (also discussed below with reference to FIG. 6G). An etch barrier layer of Au (20 microinches) is then deposited, followed by layers of Ni (40 microinches), and Cu (3-4 mils). According to option A-1, final layers of Ni (40 microinches) and Au (20 microinches) are deposited whereas in Option A-2 a final layer of Ag is deposited (100-300 microinches).

In plating Options B-1 and B-2, the initial flash Cu deposition is omitted, and in Options C-1 and C-2 the etch barrier of Au and subsequent Ni deposition are replaced by an etch barrier of tin (100–300 microinches).

A singulated semiconductor die 206 is conventionally mounted via epoxy (or other means) to the die attach pad 202, and the epoxy is cured. Gold wires 205 are then bonded between the semiconductor die 206 and peripheral leads or contacts 203. The leadframe 100 is then molded using a modified mold with the bottom cavity being a flat plate, and subsequently cured, as discussed in Applicants' application Ser. No. 09/095,803. The leadframe 100 after the foregoing steps is as shown in FIG. 6E, which includes overmold 401 of cured plastic or epoxy (0.8 mm).

The leadframe 100 is then subjected to a final alkaline etching via full immersion (FIG. 6F) which exposes an array or perimeter pattern of exposed contact pads 203, power/ground ring 204 and the die attach pad 206. According to Option A, an etch down cavity 203B is left after etching away the flash Cu, for attachment of solder balls 203A to contact pads 203, as shown in FIG. 6G. At this stage of manufacture, the power/ground ring 204 and die attach pad 202 (which also functions as a ground plane) are fully isolated and exposed. Singulation of the individual units from the full leadframe array strip 100 may then be performed either by saw singulation or die punching resulting in the final configuration of FIG. 6H. Since the entire LPCC contains short circuit connections prior to singulation, it is contemplated that the multiple circuits may be gang tested before singulation.

The fabrication process of the present invention may alternatively omit the solder ball attachment step, as shown in Options B and C.

Figure 8A:
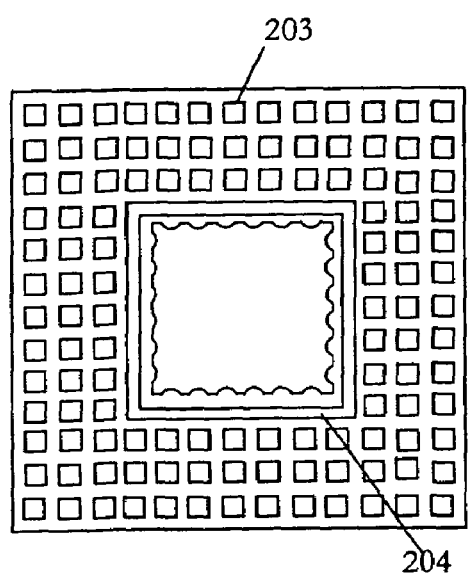
FIGS. 8A and 8B are bottom plan views of array type IC packages manufactured in accordance with the process of FIGS. 6A–6H.
Figure 8B:
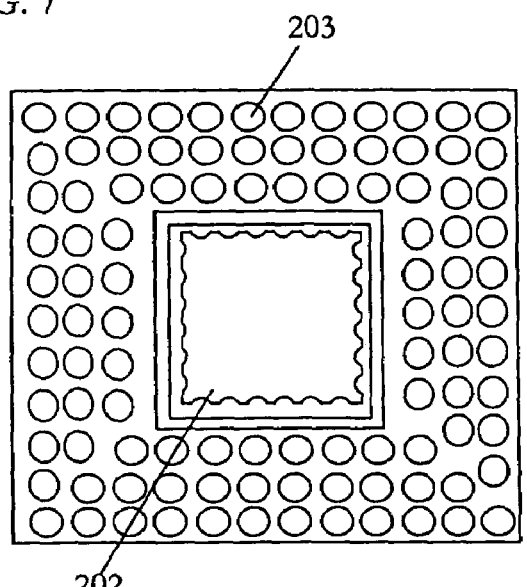

FIG. 7 is a bottom plan view of the assembled IC package according to the present invention, with a single row of I/O contacts, while FIGS. 8A and 8B show array type packages manufactured in accordance with the process of FIGS. 6A–6H. In FIG. 8A, the contact pads 203 are round, whereas in FIG. 8B the contact pads are rectangular. The power/ground ring 204 and the interlocking pattern of the die attach pad/ground plane 202, are clearly shown.

Figure 9:
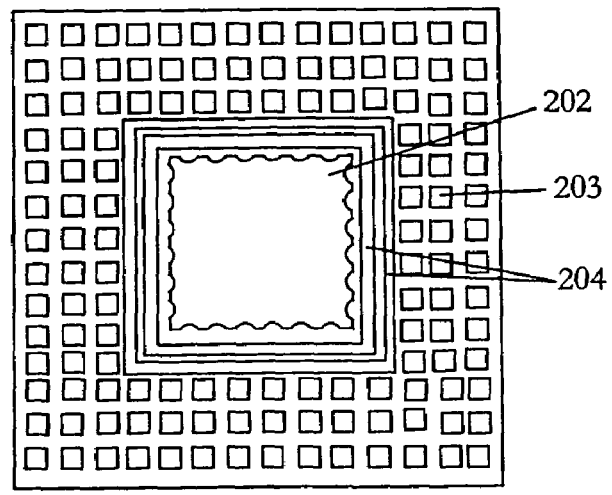
FIG. 9 is a bottom plan view of an array type IC package according to the present invention, showing a pair of concentric rings.

FIG. 9 is a bottom plan view according to yet another embodiment of the present invention, with three rows of contact pads 203, and a pair of concentric rings 204. In the present embodiment, one of the rings 204 is a power ring and the other is a ground ring.

Other embodiments of the invention are possible. For example, the two rings may be present, one being a power ring and the other being a ground ring. All such embodiments are believed to be within the sphere and scope of the invention as set forth in the claims appended hereto.

We claim:

1. A leadless plastic chip carrier, comprising:
   a semiconductor die mounted to a ground plane;
   at least one row of contact pads circumscribing said ground plane;
   a plurality of wire bonds connecting said semiconductor die and said at least one row of contact pads; and
   an overmold covering said semiconductor die, said wire bonds and said at least one row of contact pads and said ground plane, such that at least one surface of said at least one row of contact pads and at least one surface of said ground plane are exposed from the overmold; wherein
said at least one row of contact pads is recessed into said overmold to form a plurality of etch down cavities.

2. The leadless plastic chip carrier of claim 1, wherein each of said contact pads comprises a plurality of metal layers deposited to form a rivet shape in profile.

3. The leadless plastic chip carrier of claim 2, wherein said plurality of metal layers comprises successive layers of Au, Ni, Cu, Ni and Au.

4. The leadless plastic chip carrier of claim 2, wherein said plurality of metal layers comprises successive layers of Au, Ni, Cu, and Ag.

5. The leadless plastic chip carrier of claim 2, wherein said plurality of metal layers comprises successive layers of Tin, Cu, Ni and Au.

6. The leadless plastic chip carrier of claim 2, wherein said plurality of metal layers comprises successive layers of Tin, Cu, and Ag.

7. The leadless plastic chip carrier of claim 1, wherein each of said contact pads is round.

8. The leadless plastic chip carrier of claim 1, wherein each of said contact pads is rectangular.

9. The leadless plastic chip carrier of claim 1, further including a plurality of solder balls within said etch down cavities and connected to said at least one row of contact pads.

10. The leadless plastic chip carrier of claim 1, wherein an outer edge of said ground plane conforms to an interlock pattern.

11. The leadless plastic chip carrier of claim 1, wherein the at least one surface of said row of contact pads and the at least one surface of said ground plane that are exposed are coated with a thin uniform layer of solder.

12. A leadless plastic chip carrier, comprising:
a semiconductor die mounted to a ground plane;
at least one row of contact pads circumscribing said ground plane;
a plurality of wire bonds connecting said semiconductor die and said at least one row of contact pads; and
an overmold covering said semiconductor die, said wire bonds and said at least one row of contact pads, such that at least one surface of said at least one row of contact pads and at least one surface of said ground plane are exposed from the overmold; wherein
each of said contact pads has a rivet shape in profile.

13. The leadless plastic chip carrier of claim 12, wherein an outer edge of said ground plane conforms to an interlock pattern.

14. The leadless plastic chip carrier of claim 12, wherein said at least one row of contact pads comprises a plurality of metal layers.

15. The leadless plastic chip carrier of claim 14, wherein said plurality of metal layers comprises successive layers of Au, Ni, Cu, Ni and Au.

16. The leadless plastic chip carrier of claim 14, wherein said plurality of metal layers comprises successive layers of Au, Ni, Cu, and Ag.

17. The leadless plastic chip carrier of claim 14, wherein said plurality of metal layers comprises successive layers of Tin, Cu, Ni and Au.

18. The leadless plastic chip carrier of claim 14, wherein said plurality of metal layers comprises successive layers of Tin, Cu, and Ag.

19. The leadless plastic chip carrier of claim 12, wherein the at least one surface of said row of contact pads and the at least one surface of said ground plane that are exposed are coated with a thin uniform layer of solder.

* * * * *